(12) United States Patent
Totzeck et al.

(10) Patent No.: US 8,982,325 B2
(45) Date of Patent: Mar. 17, 2015

(54) MICROLITHOGRAPHIC PROJECTION EXPOSURE APPARATUS

(75) Inventors: Michael Totzeck, Schwaebisch Gmuend (DE); Aksel Goehnermeier, Essingen-Lauterburg (DE); Wolfgang Singer, Aalen (DE); Helmut Beierl, Heidenheim (DE); Heiko Feldmann, Aalen (DE); Hans-Juergen Mann, Oberkochen (DE); Jochen Hetzler, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 318 days.

(21) Appl. No.: 13/333,350

(22) Filed: Dec. 21, 2011

(65) Prior Publication Data

US 2012/0092637 A1 Apr. 19, 2012

Related U.S. Application Data

(63) Continuation of application No. 12/210,514, filed on Sep. 15, 2008, now Pat. No. 8,107,054.

(60) Provisional application No. 60/973,202, filed on Sep. 18, 2007.

(30) Foreign Application Priority Data

Sep. 18, 2007 (DE) .......................... 10 2007 044 678

(51) Int. Cl.
G03F 7/20 (2006.01)

(52) U.S. Cl.
CPC ........ *G03F 7/70308* (2013.01); *G03F 7/70216* (2013.01); *G03F 7/70566* (2013.01)
USPC .................... 355/71; 355/52; 355/53; 355/55; 355/67; 355/77

(58) Field of Classification Search
CPC .............. G03F 7/70216; G03F 7/7025; G03F 7/70308; G03F 7/70566; G03F 7/70958
USPC ........... 355/52, 53, 55, 67–71, 77; 250/492.1, 250/492.2, 492.22, 548; 430/5, 8, 22, 30, 430/311, 312; 356/308, 559–562, 884
See application file for complete search history.

(56) References Cited

U.S. PATENT DOCUMENTS 5,144,362 A * 9/1992 Kamon et al. ................. 355/53
5,436,692 A 7/1995 Noguchi
(Continued)

FOREIGN PATENT DOCUMENTS

EP 1 231 516 8/2002
EP 1 251 402 10/2002
(Continued)

OTHER PUBLICATIONS

English translation of JP07283130, published on Oct. 27, 1995.*
(Continued)

*Primary Examiner* — Christina Riddle
(74) *Attorney, Agent, or Firm* — Fish & Richardson P.C.

(57) ABSTRACT

The disclosure relates to a microlithographic projection exposure apparatus and a microlithographic projection exposure apparatus, as well as related components, methods and articles made by the methods. The microlithographic projection exposure apparatus includes an illumination system and a projection objective. The illumination system can illuminate a mask arranged in an object plane of the projection objective. The mask can have structures which are to be imaged. The method can include illuminating a pupil plane of the illumination system with light. The method can also include modifying, in a plane of the projection objective, the phase, amplitude and/or polarization of the light passing through that plane. The modification can be effected for at least two diffraction orders in mutually different ways. A mask-induced loss in image contrast obtained in the imaging of the structures can be reduced compared to a method without the modification.

24 Claims, 6 Drawing Sheets

(56) References Cited

U.S. PATENT DOCUMENTS

| | | | |
|---|---|---|---|
| 5,541,026 A | 7/1996 | Matsumoto | |
| 5,576,829 A * | 11/1996 | Shiraishi et al. | 356/521 |
| 5,706,091 A * | 1/1998 | Shiraishi | 356/399 |
| 5,863,712 A * | 1/1999 | Von Bunau et al. | 430/396 |
| 6,304,317 B1 | 10/2001 | Taniguchi et al. | |
| 6,433,351 B1 | 8/2002 | Yonekawa et al. | |
| 6,549,272 B1 * | 4/2003 | Chandhok et al. | 355/67 |
| 6,956,640 B2 * | 10/2005 | Lee | 355/53 |
| 7,253,907 B2 | 8/2007 | Ouchi | |
| 2002/0191288 A1 | 12/2002 | Gruner et al. | |
| 2004/0021845 A1 * | 2/2004 | Kawahara | 355/67 |
| 2004/0161678 A1 | 8/2004 | Misaka | |
| 2004/0245439 A1 | 12/2004 | Shaver | |
| 2005/0213070 A1 | 9/2005 | Scharnweber | |
| 2005/0287483 A1 * | 12/2005 | Lercel et al. | 430/394 |
| 2006/0077371 A1 * | 4/2006 | Wegmann et al. | 355/67 |
| 2006/0197933 A1 * | 9/2006 | Kawashima | 355/67 |
| 2007/0013887 A1 * | 1/2007 | Op de Beeck | 355/55 |
| 2007/0153247 A1 | 7/2007 | Nagasaka | |
| 2007/0195295 A1 | 8/2007 | Fujisawa et al. | |
| 2008/0143993 A1 * | 6/2008 | Shiozawa et al. | 355/71 |
| 2008/0158528 A1 | 7/2008 | Stoeldraijer et al. | |
| 2009/0053618 A1 * | 2/2009 | Goehnermeier | 430/5 |

FOREIGN PATENT DOCUMENTS

| | | | |
|---|---|---|---|
| JP | 07283130 A * | 10/1995 | H01L 21/027 |
| WO | WO 2006/097135 | 9/2006 | |

OTHER PUBLICATIONS

Orii, S. et al., "Quarter Micron Lithography System with Oblique Illumination and Pupil Filter," Proc. SPIE vol. 2197, p. 854-S.868 (1994).

Totzeck, "Some similarities and dissimilarities of imaging simulation for optical microscopy and lithography," Imaging simulation of microscopy and lithography, pp. 1-8, 2006.

* cited by examiner

Fig. 1
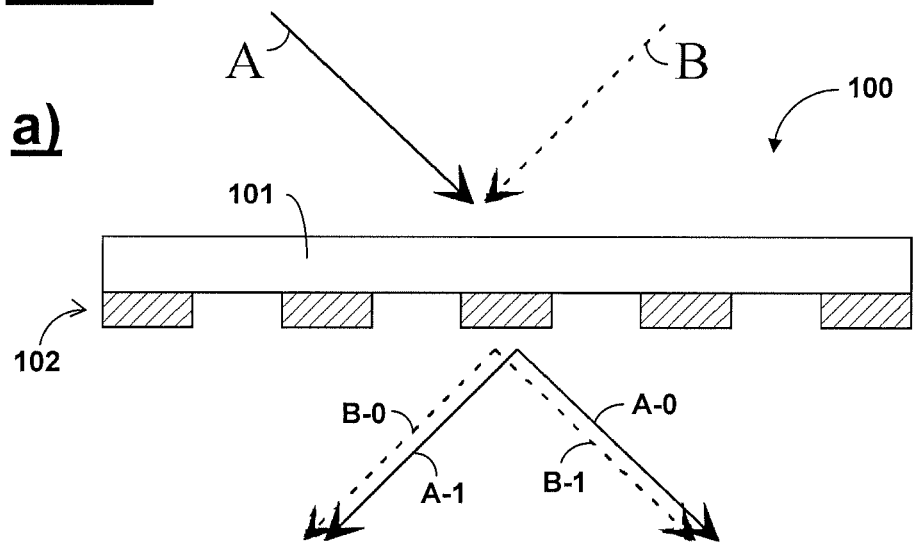
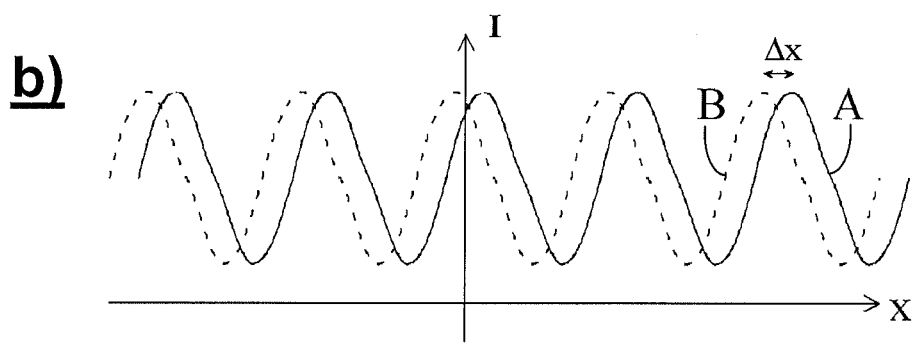
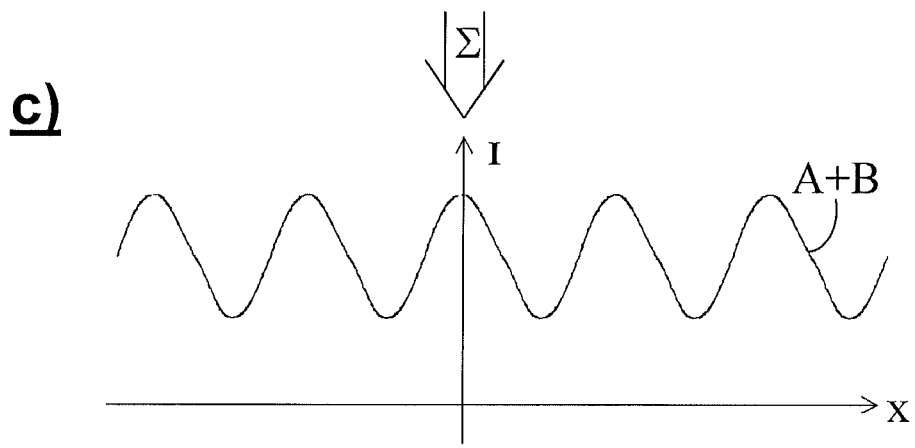

Fig. 2
a)
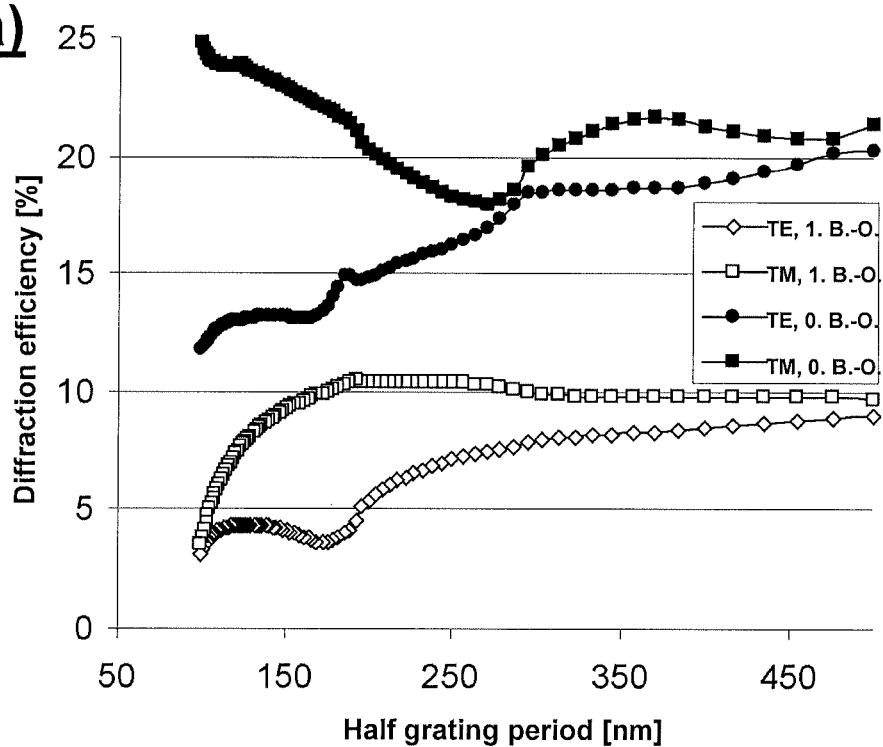
b)
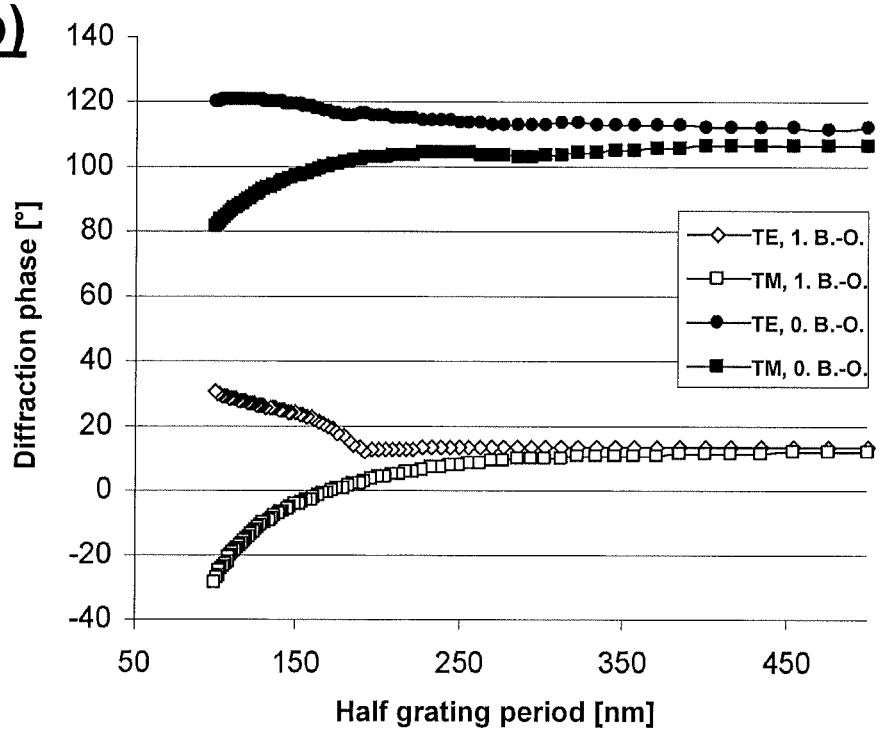

Fig. 3
a)
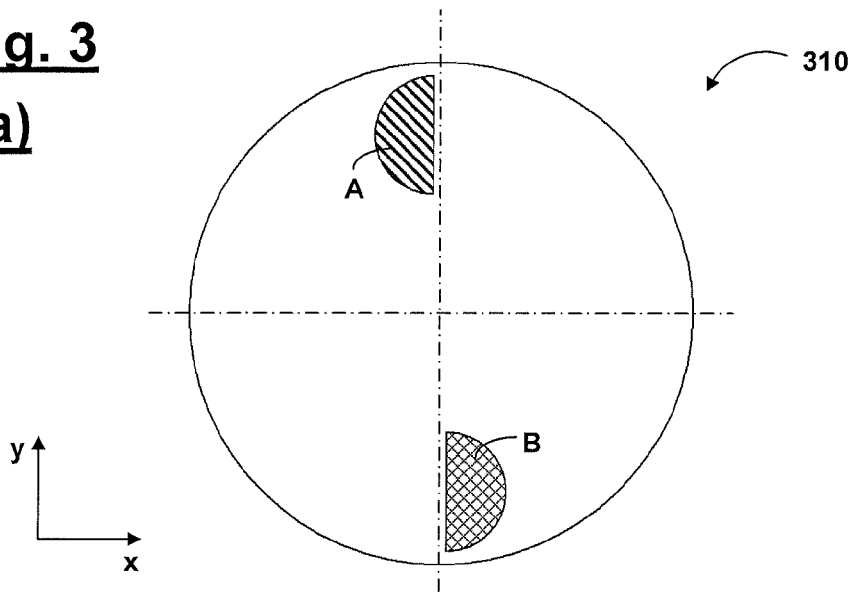
b)
c)
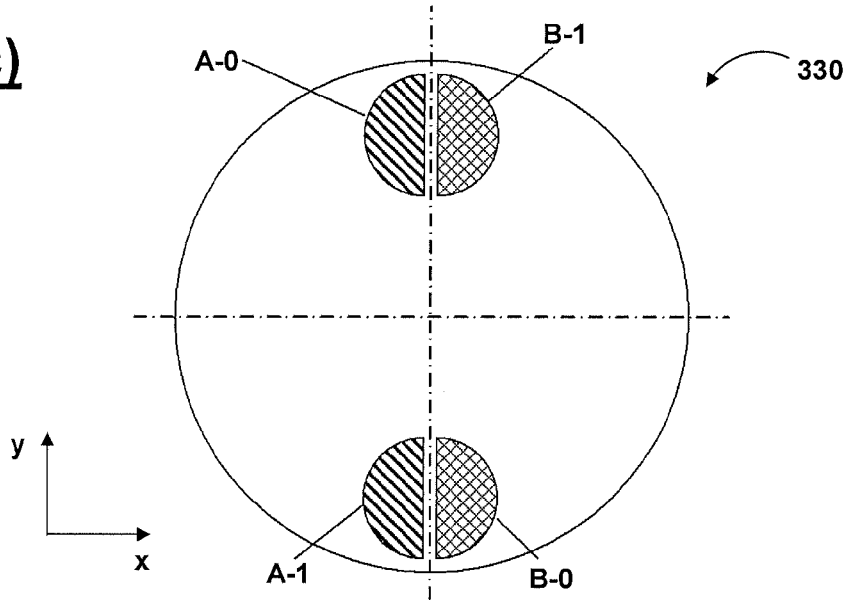

ent ways for the different diffraction orders. The optical filter can optically act in various ways, depending on the respective desired effect. In that respect it can operate on the phase, the amplitude and/or the polarization of the light which passes through the optical filter. Thus it is also possible by the optical filter to alter different diffraction orders in mutually different fashion in relation to polarization (for example for the polarization direction or the degree of polarization).

MICROLITHOGRAPHIC PROJECTION EXPOSURE APPARATUS

CROSS-REFERENCE TO RELATED APPLICATIONS

This application is a continuation of U.S. application Ser. No. 12/210,514, filed Sep. 15, 2008, which claims priority under 35 U.S.C. §119(e)(1) to U.S. Ser. No. 60/973,202, filed Sep. 18, 2007, and under 35 U.S.C. §119 to German patent application 10 2007 044 678.2, filed Sep. 18, 2007. The entire contents of these applications are incorporated herein by reference.

FIELD

The disclosure relates to a microlithographic projection exposure apparatus and a microlithographic projection exposure apparatus, as well as related components, methods and articles made by the methods.

BACKGROUND

Microlithography is used for the production of microstructured components, such as, for example, integrated circuits or LCDs. In general, the microlithography process is carried out in what is referred to as a projection exposure apparatus having an illumination system and a projection objective. Generally, the mask (commonly referred to as a reticle) is illuminated by the illumination system, and the image of the mask is projected by the projection objective onto a substrate (for example a silicon wafer). Typically, the substrate is coated with a light-sensitive layer (for example photoresist) which is arranged in the image plane of the projection objective so that the mask structure is transferred onto the light-sensitive coating on the substrate, generally reduced by a factor of 0.25.

SUMMARY

In some embodiments, the disclosure provides a microlithographic projection exposure apparatus and a method of its operation that can provide improved compensation of aberrations caused by mask structures.

In certain embodiments, the disclosure provides a method of operating a microlithographic projection exposure apparatus. The apparatus has an illumination system and a projection objective. The illumination system illuminates a mask arranged in an object plane of the projection objective. The mask has structures which that are to be imaged. The method includes illuminating a pupil plane of the illumination system with light. The method also includes modifying, in a plane of the projection objective, the phase, amplitude and/or polarization of the light passing through that plane. Modification is effected for at least two diffraction orders in mutually different ways, whereby a mask-induced loss in image contrast obtained in the imaging of the structures is reduced compared to a method without the modification.

The method can involve separating from each other diffraction orders which are generated by points in mirror image symmetry relative to each other in the pupil plane of the illumination system.

It is possible to set in the illumination system an illumination setting (a given intensity distribution in the pupil plane of the illumination system) which is in point symmetry relationship with respect to the pupil center, but not in mirror image symmetry relationship with respect to a plane of symmetry of the structure which is to be imaged. In accordance with its definition, the edge of the pupil is defined by rays which are incident on the field plane (reticle plane) in the optical system or the illumination system at the maximum aperture angle. That can provide that different diffraction orders (in particular the zero and the first diffraction orders) which are generated by the light emanating from points which are in mirror image symmetrical relationship with each other in the pupil plane of the illumination system come to lie at different locations in a pupil plane of the projection objective. Consequently those diffraction orders can be modified separately or independently of each other, by for example using an optical filter which, by way of its optically effective surface, has regions that can have different influence on phase and/or amplitude for at least one polarization direction.

In some embodiments, the modifying is carried out in such a way that for a first illumination direction a first interference image is obtained and for a second illumination direction a second interference image is obtained, where a lateral offset between the first interference image and the second interference images is reduced. In certain embodiments, the lateral offset is reduced to a value of not more than 5% (e.g., not more than 2.5%) of a period of the first or second interference image. In some embodiments, the lateral offset is reduced at least by a factor of 2 (e.g., at least by a factor of 3, at least by a factor of 4).

The change or difference in the diffraction phase, if the half grating period (or half pitch) is reduced down to approximately 100 nm, may, for example, correspond to approximately 11% of the period of the structure. This is because the change or difference in the diffraction phase directly appears as lateral offset between the respective interference images for two different illumination directions. In practice, such lateral offsets in the range of approximately 10% can begin to have negative effects on the result of the lithographic process or the technical application, respectively. In certain embodiments, this lateral offset is reduced to not more than 5% (e.g., not more than 2.5%) of the period of the structure.

In some embodiments, monopoles of the set illumination setting are arranged in mirror image symmetrical relationship with each other in the pupil plane of the illumination system and illuminate the mask at different moments in time (e.g., only at different moments in time) with a time difference or a time interval ΔT therebetween. Then, in the exposure process, an altered phase, amplitude or polarization modification is produced after expiry of the time interval ΔT, in the projection objective. That can be achieved via an optical filter by either replacing the optical filter or by adjusting the optical filter with respect to the arrangement of its region or regions which modify the phase and/or amplitude.

The disclosure is not limited to replacing or adjusting an optical filter. For example, in some embodiments, the modification of phase, amplitude and/or phase shift, which is achieved after expiry of the time interval ΔT (or at the moment of illumination of the respective other illumination pole of the set illumination setting) in the projection objective can also be implemented via a lens decentering procedure, a lens displacement along the optical axis of the projection objective, a lens tilting movement, a lens bending effect or by the manipulation of a mirror surface in the projection objective. Local thermal changes in lenses due for example to IR radiation can also be used for a modification to the phase.

In some embodiments, an optical filter is used, which over its optically effective surface has regions involving differing phase shift and/or amplitude influencing for at least one polarization direction. A change in polarization can be achieved, in the event of phase and/or amplitude being influenced in different ways, for various polarization directions. If the phase and/or amplitude for different polarization directions are influenced in the same manner in contrast that affords a purely scalar change in transmission or change in phase without a change in polarization.

In certain embodiments, the structures of the mask have at least one repetition direction. In such embodiments, illuminating the pupil plane of the illumination system can be effected with an intensity distribution which has two illumination poles.

In some embodiments, a connecting straight line between the centroids of the illumination poles are neither perpendicular nor parallel to the repetition direction.

In certain embodiments, an angle between the centroids of the illumination poles and the repetition direction is less than 45° (e.g., less than 35°, less than 25°, less than) 15°.

In some embodiments, in a pupil plane of the projection objective the first diffraction order of one illumination pole is located at least in close neighborhood to the zero diffraction order of the other illumination pole, and vice versa.

In certain embodiments, a characteristic width (which may in particular be a half grating period also called half pitch, wherein pitch denotes the period of the grid) of the structures on the mask to be imaged, is not more than two times of the wavelength (e.g., not more than 1.4 times of the wavelength, not more than 1.2 times of the wavelength, not more than the wavelength) of the light used in the microlithography process.

In some embodiments, the characteristic width of the structures on the mask to be imaged is not more than 300 nm (e.g., not more than 250 nm, not more than 200 nm). For a typical imaging scale of 1/4, a half-pitch of, for example, 180 nm corresponds to a typical structure width of 45 nm on the wafer. In such situations, the concept of the disclosure can be particularly effective because the influence of aberrations introduced by the mask can become particularly noticeable with decreasing grating period, such as when the structures on the mask to be imaged comes in the proximity of the wavelength of the light used in the microlithography process.

In some embodiments, the disclosure provides a method of operating a microlithographic projection exposure apparatus. The apparatus includes an illumination system and a projection objective. The illumination system illuminates a mask arranged in an object plane of the projection objective. The mask has structures which are to be imaged. The method includes illuminating a pupil plane of the illumination system with light. The method also includes modifying, in a plane of the projection objective, the polarization of the light passing through that plane. The modification is effected for at least two diffraction orders in mutually different ways.

In certain embodiments, the disclosure provides an optical system of a projection objective of a microlithographic projection exposure apparatus. The optical system includes an optical filter configured to manipulate light passing through the optical filter. The positional dependency of the manipulation caused by that optical filter can be described by the equation:

$$M(x,y)=M(-x,-y)$$

where x and y denote positional co-ordinates in a plane of the projection objective, and wherein M is a parameter characteristic of the light passing through the optical filter. The parameter characteristic of the light passing through the optical filter can be the amplitude, phase or polarization of that light.

The disclosure relates to a microlithographic projection exposure apparatus, a process for the microlithographic production of microstructured components, and a microstructured component.

Further configurations of the disclosure are set forth in the description, claims and figures. The disclosure is described in greater detail hereinafter by means of embodiments by way of example illustrated in the accompanying drawings.

BRIEF DESCRIPTION OF THE DRAWINGS

In the drawings:

FIGS. 1a-c show diagrammatic views to explain the effect of mask aberrations on the microlithography process, FIGS. 2a-b show diagrams by way of example illustrating calculated dependencies in respect of diffraction efficiency (FIG. 2a) and diffraction phase (FIG. 2b) on half the grating period in the structure of a mask for different diffraction orders and different polarization states, FIGS. 3a-c show diagrammatic views to illustrate a method.

DETAILED DESCRIPTION

Figure 4:
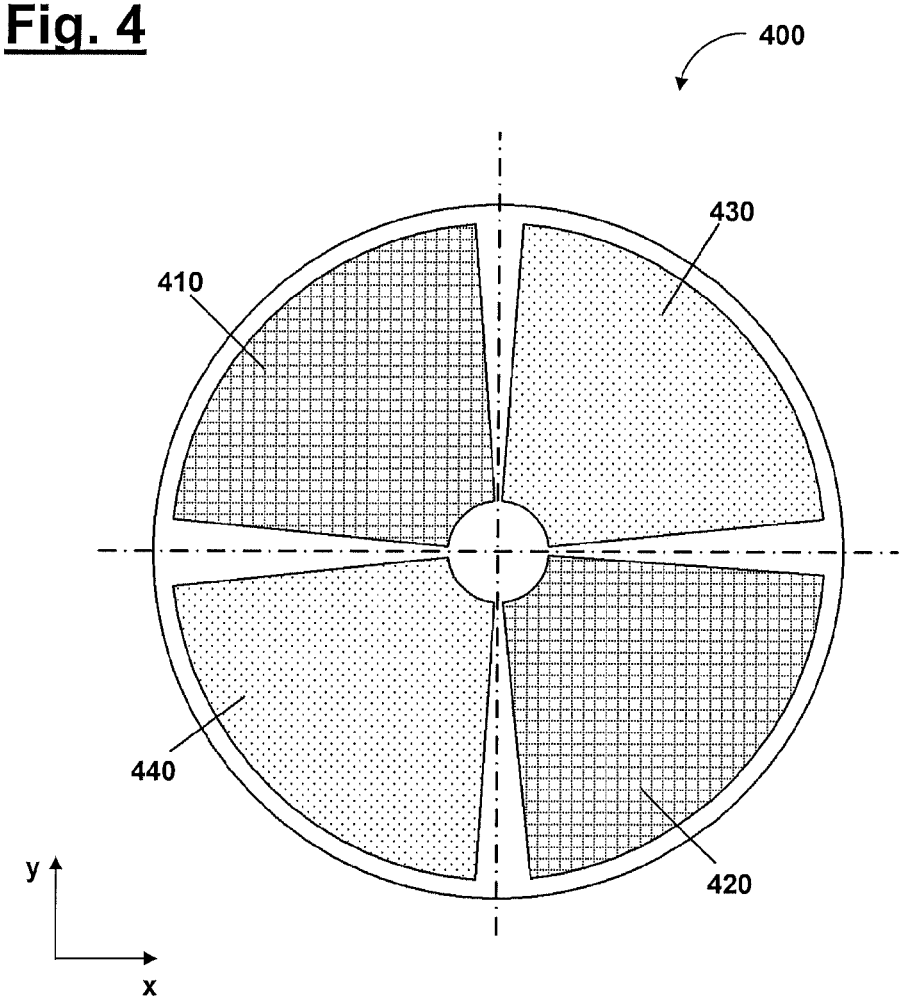
FIG. 4 shows a diagrammatic view of an optical filter.

If the width of the structures on the mask is in the proximity of the wavelength of the light used in the microlithography process, the mask can introduce aberrations because the diffraction orders can experience a phase and amplitude change, the magnitude of which depends on the period of the mask structures.

FIG. 1a illustrates a situation in which light is incident on a mask 100 at two different directions of incidence identified by "A" and "B" respectively. Mask 100 has structures 102 (for example of chromium, Cr), arranged on a mask substrate 101 (for example of quartz glass, $SiO_2$). Diffraction orders occurring as a consequence of diffraction at the structures 102 downstream of the mask 100 are denoted for the light from the direction of incidence A by A-0 (=zero diffraction order) and A-1 (=first diffraction order), and for the light from the direction of incidence B by B-0 (=zero diffraction order) and B-1 (=first diffraction order). FIG. 1b shows the intensity variation in dependence on the positional coordinate x for the partial images respectively produced with the light from the different directions of incidence A and B. FIG. 1c shows the intensity variation obtained by summing of those two partial images. The total image afforded by addition of the two partial images as shown in FIG. 1c is of a contrast which is reduced in comparison with the individual partial images.

For a first different illumination direction A, an interference is obtained between the first diffraction order A-1 with the zero diffraction order A-0, which produces a first interference image which is labeled with "A" in FIG. 1b. For a second illumination direction B, an interference is obtained between the first diffraction order B-1 with the zero diffraction order B-0, which produces a second interference image which is labeled with "B" in FIG. 1b. The first and second interference images or partial images, respectively, are laterally displaced with respect to each other, i.e. have a lateral offset Δx, which can be seen in FIG. 1b by comparison between the solid and dashed line. The lateral offset Δx corresponds to a fading or decreased contrast, as can be seen in FIG. 1c, which can have negative effects.

FIGS. 2a and 2b show, for the example of a binary chromium-quartz glass mask, the calculated dependency with respect to diffraction efficiency (in percent, FIG. 2a) and diffraction phase (in degrees, FIG. 2b) on half the grating period (in nm), in each case both for the zero diffraction order and the first diffraction order as well as for two mutually orthogonal polarization states (TE and TM). The calculation was implemented by what is referred to as the RCWA theory. From the configuration of the respective curves in FIGS. 2a and 2b, it is apparent the effects of aberrations introduced by the mask become only comparatively slightly noticeable at a value of half the grating period of about 500 nm (corresponding to a grating period of 1 μm) as the curves represent approximately horizontal straight lines and also the degree of deviation of the curves for respectively orthogonal polarization states is slight. With a decreasing grating period the respective curves differ markedly from a straight-line configuration, while in addition there are marked differences for mutually orthogonal polarization states.

Referring to FIG. 2b, the change or difference in the diffraction phase, if the half grating period (or half pitch) is reduced down to approximately 100 nm, has a value of roughly 40°. This value appears as lateral offset between the respective interference images for two different illumination directions and corresponds to approximately 11% of the period. It can therefore be desirable to reduce this lateral offset and the accompanying loss in image contrast.

FIGS. 3a-c describe a method carried out in a microlithographic projection exposure apparatus for which a structure by way of example is described hereinafter with reference to FIG. 6.

FIG. 3a diagrammatically shows an intensity distribution 310 which is set in a pupil plane of the illumination system (by using one or more suitable pupil-forming elements, for example diffractive optical elements). FIG. 3b is a view in greatly simplified fashion of a structure 320 by way of example, as can be provided on a mask arranged in the object plane of the projection objective. FIG. 3c is also a diagrammatic view showing the arrangement of the zero and first diffraction orders obtained in a pupil plane of the projection objective by virtue of diffraction at the mask structure 320.

The intensity distribution in the pupil plane of the illumination system, that is to say what is referred to as the illumination setting, includes as shown in FIG. 3a precisely two illumination poles which are denoted by "A" and "B" respectively and which in the pupil plane extend in point symmetrical relationship with a point on the optical axis of the illumination system, but which are not in mutually mirror image symmetrical relationship, with respect to an axis of symmetry of the structure whose image is to be formed. In other words, a connecting line joining the two illumination poles "A" and "B" does not extend perpendicularly to the structure direction (extending in the x-direction as shown in FIG. 3b) of the mask structure 320.

As can be seen from FIG. 3c the consequence of that choice of the illumination setting is that the different diffraction orders (in particular the zero and first diffraction orders) which are produced as a consequence of diffraction of the light of the two illumination poles in the pupil plane of the projection objective come to lie at mutually different positions in the pupil plane of the projection objective. The region involving the zero diffraction order for the diffraction pole A in FIG. 3a is identified by "A-0", the region of the first diffraction order for the diffraction pole A is identified by "A-1", the region of the zero diffraction order for the illumination pole B is denoted by "B-0" and the region of the first diffraction order for the illumination pole B is denoted by "B-1".

The regions "A-0", "A-1", "B-0" and "B-1" can be influenced in different ways from each other to at least partially compensate for mask aberrations. The influencing effect can be implemented with respect to the phase and/or amplitude for at least one polarization direction.

FIG. 4 shows an example an optical filter 400 which is suitable for that purpose and which is made up of portions 410-440 which in the example are in the form of segments of a circle, in which case the portions 410 and 420 have transmission and/or phase shift properties which are different from the transmission and phase shift properties respectively of the regions 430 and 440. In filter 400 the phase shift properties of the regions 410 and 420 (and the regions 430 and 440 respectively) are respectively mutually coincident.

Figure 5:
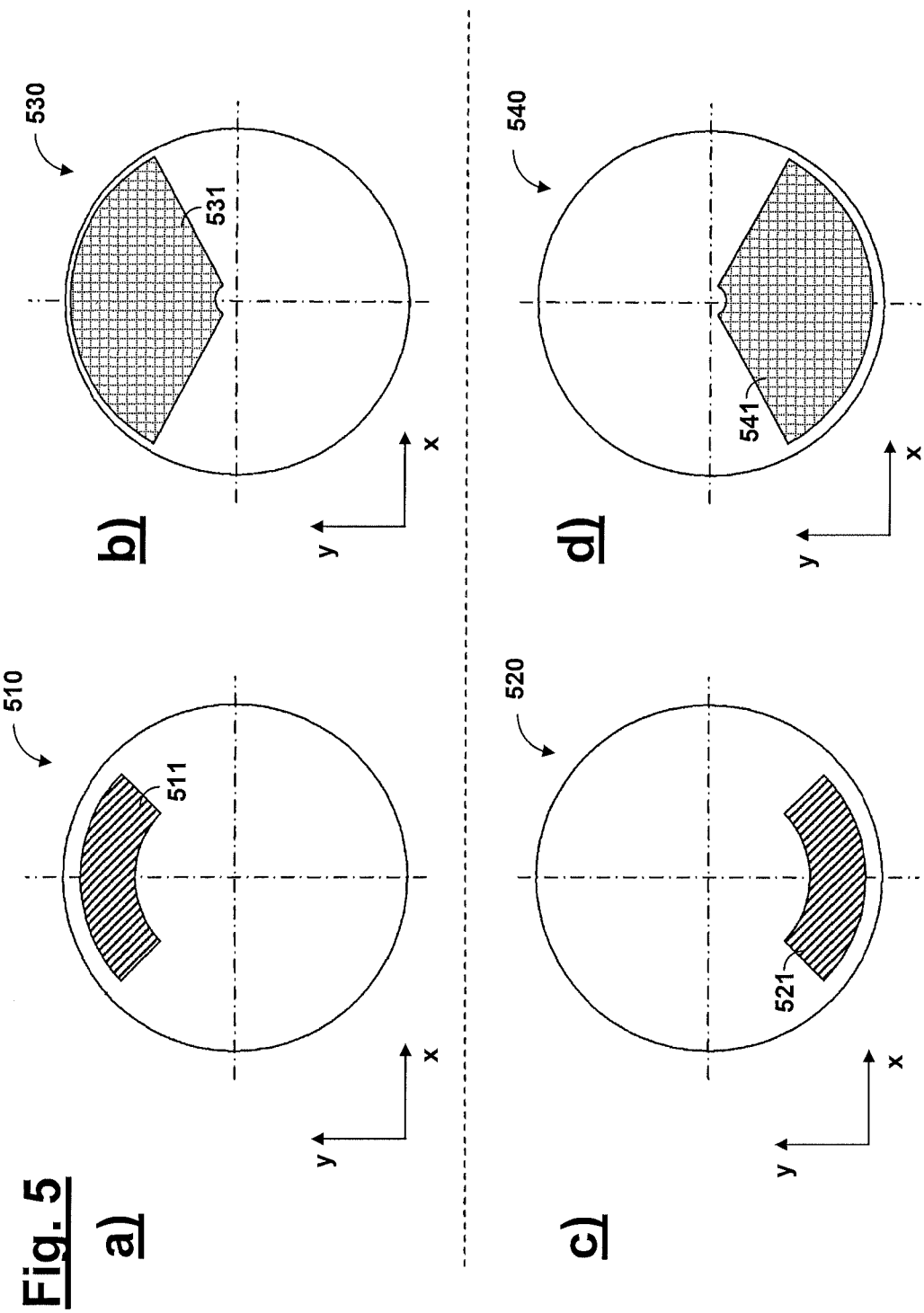
FIG. 5a-d show diagrammatic views to illustrate a method.

FIG. 5a and FIG. 5c show illumination poles 511 and 521 which are produced in a pupil plane of the illumination system in such a way that they are arranged both in point symmetrical relationship with a point on the optical axis of the illumination system and also in mutually mirror image symmetrical relationship with respect to a plane intersecting that optical axis or with respect to an axis of symmetry of the structure, the image of which is to be produced.

Illumination of illumination poles 511 and 521 occurs not at the same time but at different moments in time or at different field points in the scanning operation. At the different moments in time, the phase, amplitude and/or polarization are manipulated differently in the projection objective. As an example, an optical filter can be used in the projection objective for this purpose. In such embodiments, in the time interval between the two moments in time, the optical filter can either be replaced or can be adjusted with respect to the arrangement of its regions that manipulate amplitude, phase or polarization. FIG. 5b shows an example in which an optical filter 530 is used in the projection objective during exposure with the illumination setting of FIG. 5a. FIG. 5d shows an example where an optical filter 540 is used during exposure with the illumination setting of FIG. 5c. Optical filters 530 and 540 differ from each other with respect to the transmission and/or phase shift they produce.

In some embodiments, time-displaced exposure with different illumination settings can be implemented as follows. The wafer is exposed using a first illumination setting. There is then a change in the illumination setting and an optical filter, and the wafer is exposed using a second illumination setting. Typical change rates can be in the seconds range. If a through-put rate of, for example, 120 wafers per hour with single exposure is assumed to apply, a change in the optical filter can take place in terms of order of magnitude, for example, every 30 seconds.

WO 2006/097135 A1 discloses arrangements for and methods of rapidly changing illumination settings. Similar methods can be used for a rapid change of an optical filter, for example in a pupil plane of the projection objective. US No 2007/0153247 A1 or US No 2005/0213070 A1 disclose systems in which the scanner slot can be divided into two regions so as to make different pupil regions or planes manipulatable separately. Such systems can be implemented in the system described herein.

Figure 6:
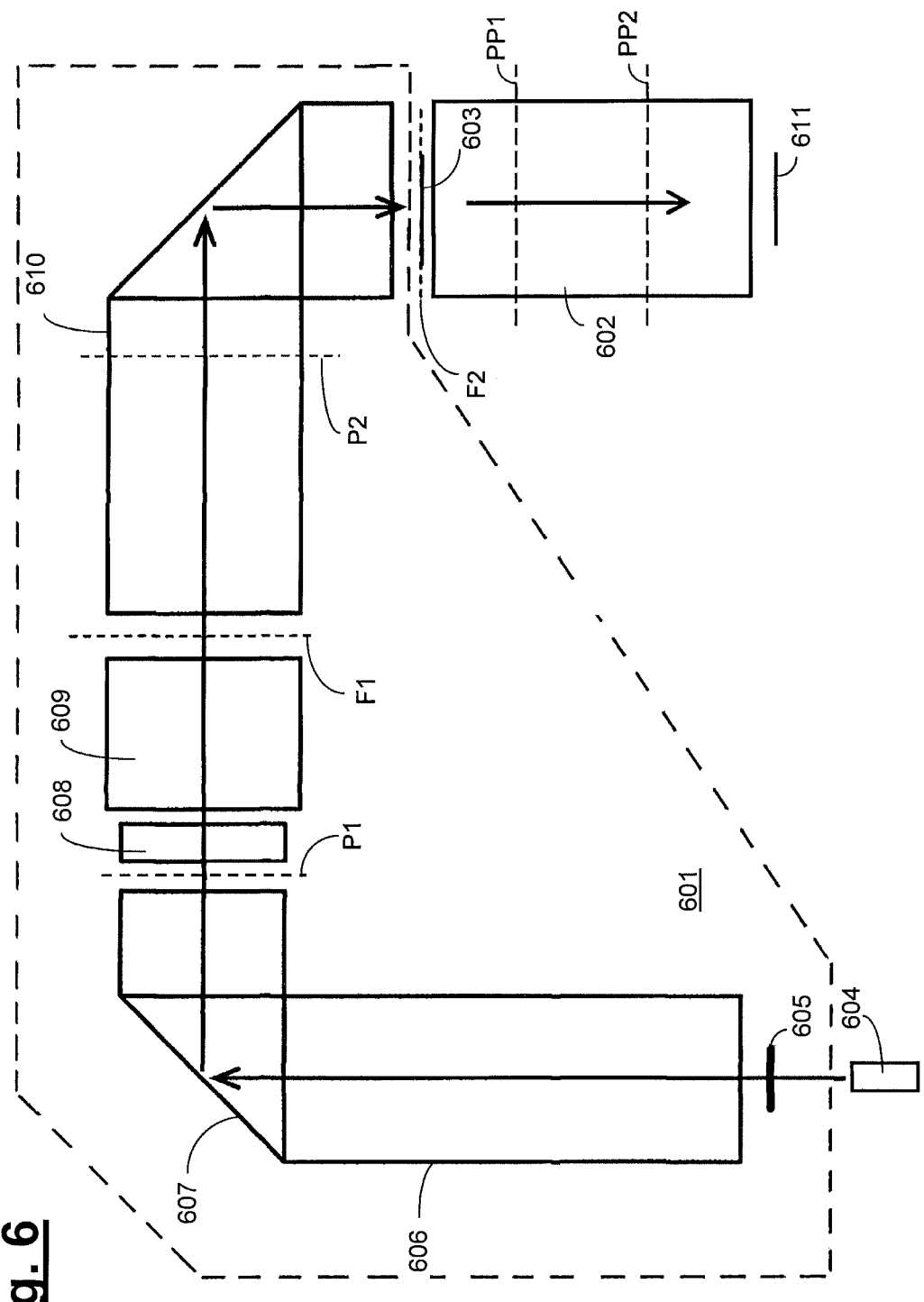
FIG. 6 shows a diagrammatic view illustrating the structure in principle of a microlithographic projection exposure apparatus.

FIG. 6 is a purely diagrammatic view showing a structure in principle and by way of example of a microlithographic projection exposure apparatus. The microlithographic projection exposure apparatus has an illumination system 601 and a projection objective 602. The illumination system 601 serves for illuminating a structure-bearing mask (reticle) 603 with light from a light source unit 604 which for example includes an ArF laser for a working wavelength of 193 nm as well as a beam shaping optical mechanism for producing a parallel light beam. The parallel light beam of the light source unit 604 is firstly incident on a diffractive optical element 605 which, by way of an angle radiation characteristic defined by the respective diffractive surface structure, produces in a pupil plane P1 a desired intensity distribution (for example dipole or quadrupole distribution). Disposed downstream of the diffractive optical element 605 in the light propagation direction is an optical unit 606 including a zoom objective for producing a parallel light beam of variable diameter, and an axicon lens. Different illumination configurations are produced by the zoom objective in conjunction with the upstream-disposed diffractive optical element 605 in the pupil plane P1 depending on the respective zoom position and the position of the axicon elements. In the illustrated embodiment the optical unit 606 further includes a deflection mirror 607. Disposed downstream of the pupil plane P1 in the light propagation direction in the beam path is a light mixing device 608 which for example in per se known manner can have an arrangement of microoptical elements that is suitable for achieving a light mixing effect. The light mixing device 608 is followed in the light propagation direction by a lens group 609, downstream of which is disposed a field plane F1 with a reticle masking system (REMA) which is projected by an REMA objective 610 following in the light propagation direction onto the structure-bearing mask (reticle) 603 arranged in the field plane F2 and thereby limits the illuminated region on the reticle. The image of the structure-bearing mask 603 is formed with the projection objective 602 which in the illustrated embodiment has two pupil planes PP1 and PP2, on a substrate 611 or a wafer provided with a light-sensitive layer.

While certain embodiments have been described, it will be appreciated by one skilled in the art that variations and alternatives are possible.

The invention claimed is:

1. An apparatus, comprising:
  an illumination system; and
  a projection objective comprising an optical filter configured so that, during use of the apparatus, the optical filter manipulates light passing through the optical filter, a positional dependency of the manipulation of the light caused by the optical filter being described by the equation:

$$M(x,y)=M(-x,-y)$$

wherein:
  x and y denote positional coordinates in a plane of the projection objective;
  M is a parameter characteristic of the light passing through the optical filter;
  during use of the apparatus, at least two diffraction orders of the light are influenced by the optical filter in ways different from each other with respect to a polarization; and
  the apparatus is a microlithographic projection exposure apparatus.

2. The apparatus of claim 1, wherein M is a phase of the light which passes through the optical filter during use of the apparatus.

3. The apparatus of claim 1, wherein M is a polarization of the light which passes through the optical filter during use of the apparatus.

4. The apparatus of claim 1, wherein the optical filter comprises portions which are both adjacent along a circumferential direction and have phase shift properties which are different from each other.

5. The apparatus of claim 1, wherein the optical filter comprises portions which are both opposite to each other along a circumferential direction and have phase shift properties which are respectively mutually coincident.

6. The apparatus of claim 1, wherein the optical filter is configured so that, during use of the apparatus when light passes through the optical filter, the light undergoes a phase shift φ with a positional dependency described by the equation $\phi(x, y)=\phi(-x, -y)$.

7. A process, comprising:
  providing the apparatus of claim 1;
  using the illumination system of the apparatus to illuminate a mask; and
  using the projection objective of the apparatus to direct light from the mask to a light-sensitive layer.

8. The apparatus of claim 1, wherein:
  during use of the apparatus, an intensity distribution of light at a pupil plane of the illumination system comprises first and second illumination poles;
  the first and second poles each have a semicircular shape; and
  the first and second poles have a point symmetrical relationship with respect to a point on an optical axis of the illumination system.

9. The apparatus of claim 1, wherein the at least two diffraction orders comprise a zero order diffraction and a first order diffraction.

10. An apparatus, comprising:
  an illumination system; and
  a projection objective comprising an optical filter configured to manipulate light passing through the optical filter,
  wherein the apparatus is a microlithographic projection exposure apparatus; wherein during use of the apparatus, a pupil plane of the illumination system is illuminated:
    a) with an intensity distribution that is not in mirror image symmetrical relationship with respect to a plane of symmetry of structures of a mask; or
    b) so that at least two regions arranged in mirror image symmetrical relationship with each other in the pupil plane of the illumination system are illuminated at different moments in time; and
  wherein, during use of the apparatus, at least two diffraction orders of the light passing through the optical filter are influenced by the optical filter in ways different from each other with respect to a polarization.

11. The apparatus of claim 10, wherein, during use of the apparatus, the pupil plane of the illumination system is illuminated with an intensity distribution that is not in mirror image symmetrical relationship with respect to a plane of symmetry of the structures of the mask.

12. The apparatus of claim 10, wherein, during use of the apparatus, the pupil plane of the illumination system is illuminated so that at least two regions arranged in mirror image symmetrical relationship with each other in the pupil plane of the illumination system are illuminated at different moments in time.

13. The apparatus of claim 10, wherein, during use of the apparatus, a positional dependency of the manipulation of the light caused by the optical filter is described by the equation:

$$M(x,y)=M(-x,-y)$$

wherein x and y denote positional co-ordinates in a plane of the projection objective, and M is a parameter characteristic of the light passing through the optical filter.

14. A process, comprising:
providing the apparatus of claim 10;
using the illumination system of the apparatus to illuminate a mask; and
using the projection objective of the apparatus to direct light from the mask to a light-sensitive layer.

15. The apparatus of claim 10, wherein:
during use of the apparatus, the pupil plane of the illumination system is illuminated with an intensity distribution comprising first and second illumination poles;
the first and second poles each have a semicircular shape; and
the first and second poles have a point symmetrical relationship with respect to a point on an optical axis of the illumination system.

16. The apparatus of claim 10, wherein the at least two diffraction orders comprise a zero order diffraction and a first order diffraction.

17. An optical system, comprising:
an optical filter configured to be used in a projection objective of a microlithographic projection exposure apparatus, the optical filter being configured so that, during use of the optical system, the optical filter manipulates light passing through the optical filter,
wherein the optical filter is point symmetrical in a two-dimensional coordinate system having two axes, and the optical filter is not mirror symmetrical with respect to at least one of the two axes of the two-dimensional coordinate system; and
wherein the optical filter is configured so that, during use of the optical system, at least two diffraction orders of the light passing through the optical filter are influenced by the optical filter in ways different from each other with respect to a polarization.

18. An apparatus, comprising:
an illumination system; and
a projection objective comprising an optical system according to claim 17,
wherein the apparatus is a microlithographic projection exposure apparatus.

19. A method, comprising:
using an illumination system of a microlithographic exposure apparatus to illuminate a mask; and
using a projection objective of the microlithographic exposure apparatus to direct light from the mask to a light-sensitive layer, the projection objective comprising the optical system of claim 17.

20. The apparatus of claim 17, wherein:
during use of the optical system, a pupil plane of an illumination system of the microlithographic projection exposure apparatus is illuminated with an intensity distribution comprising first and second illumination poles;
the first and second poles each have a semicircular shape; and
the first and second poles have a point symmetrical relationship with respect to a point on an optical axis of the microlithographic projection exposure apparatus.

21. The apparatus of claim 17, wherein the at least two diffraction orders comprise a zero order diffraction and a first order diffraction.

22. An apparatus, comprising:
an illumination system; and
a projection objective comprising an optical filter configured so that, during use of the apparatus, the optical filter manipulates light passing through the optical filter, a positional dependency of the manipulation of the light caused by the optical filter being described by the equation:

$$M(x,y)=M(-x,-y)$$

wherein:
x and y denote positional coordinates in a plane of the projection objective;
M is a parameter characteristic of the light passing through the optical filter; during use of the apparatus:
at least two diffraction orders of the light are influenced by the optical filter in ways different from each other with respect to a polarization; and
the at least two diffraction orders of the light are influenced by the optical filter in ways different from each other with respect to both a phase and the polarization; and
the apparatus is a microlithographic projection exposure apparatus.

23. An apparatus, comprising:
an illumination system; and
a projection objective comprising an optical filter configured to manipulate light passing through the optical filter,
wherein the apparatus is a microlithographic projection exposure apparatus; wherein during use of the apparatus, a pupil plane of the illumination system is illuminated:
a) with an intensity distribution that is not in mirror image symmetrical relationship with respect to a plane of symmetry of structures of a mask; or
b) so that at least two regions arranged in mirror image symmetrical relationship with each other in the pupil plane of the illumination system are illuminated at different moments in time, and
wherein during use of the apparatus:
at least two diffraction orders of the light passing through the optical filter are influenced by the optical filter in ways different from each other with respect to a polarization; and
the at least two diffraction orders of the light are influenced by the optical filter in ways different from each other with respect to both a phase and the polarization.

24. An optical system, comprising:
an optical filter configured to be used in a projection objective of a microlithographic projection exposure apparatus, the optical filter being configured so that, during use of the optical system, the optical filter manipulates light passing through the optical filter,
wherein the optical filter is point symmetrical in a two-dimensional coordinate system having two axes, and the optical filter is not mirror symmetrical with respect to at least one of the two axes of the two-dimensional coordinate system;
wherein the optical filter is configured so that, during use of the optical system:
at least two diffraction orders of the light passing through the optical filter are influenced by the optical filter in ways different from each other with respect to a polarization; and
the at least two diffraction orders of the light are influenced by the optical filter in ways different from each other with respect to both a phase and the polarization.

* * * * *

UNITED STATES PATENT AND TRADEMARK OFFICE
CERTIFICATE OF CORRECTION

PATENT NO. : 8,982,325 B2
APPLICATION NO. : 13/333350
DATED : March 17, 2015
INVENTOR(S) : Michael Totzeck et al.

Page 1 of 1

It is certified that error appears in the above-identified patent and that said Letters Patent is hereby corrected as shown below:

In the Specification

Col. 3, line 16, delete "than) 15°." and insert -- than 15°). --.

Signed and Sealed this
Eighth Day of September, 2015

Michelle K. Lee
*Director of the United States Patent and Trademark Office*